(12) United States Patent
Zhang et al.

(10) Patent No.: US 12,136,671 B2
(45) Date of Patent: Nov. 5, 2024

(54) GATE-ALL-AROUND FIELD-EFFECT TRANSISTOR HAVING SOURCE SIDE LATERAL END PORTION SMALLER THAN A THICKNESS OF CHANNEL PORTION AND DRAIN SIDE LATERAL END PORTION

(71) Applicant: International Business Machines Corporation, Armonk, NY (US)

(72) Inventors: Jingyun Zhang, Albany, NY (US); Choonghyun Lee, Rensselaer, NY (US); Takashi Ando, Tuckahoe, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/566,875

(22) Filed: Dec. 31, 2021

(65) Prior Publication Data
US 2022/0123144 A1  Apr. 21, 2022

Related U.S. Application Data

(62) Division of application No. 16/147,680, filed on Sep. 29, 2018, now Pat. No. 11,239,359.

(51) Int. Cl.
| | | |
|---|---|---|
| *H01L 29/423* | (2006.01) | |
| *H01L 29/06* | (2006.01) | |
| *H01L 29/08* | (2006.01) | |
| *H01L 29/10* | (2006.01) | |
| *H01L 29/161* | (2006.01) | |
| *H01L 29/66* | (2006.01) | |
| *H01L 29/78* | (2006.01) | |
| *H01L 29/786* | (2006.01) | |

(52) U.S. Cl.
CPC ...... *H01L 29/7827* (2013.01); *H01L 29/0673* (2013.01); *H01L 29/0847* (2013.01); *H01L 29/1033* (2013.01); *H01L 29/161* (2013.01); *H01L 29/42392* (2013.01); *H01L 29/66545* (2013.01); *H01L 29/78696* (2013.01)

(58) Field of Classification Search
CPC ............ H01L 29/42392; H01L 29/495; H01L 29/512; H01L 29/78696
See application file for complete search history.

(56) References Cited

U.S. PATENT DOCUMENTS

| | | |
|---|---|---|
| 7,332,386 B2 | 2/2008 | Lee |
| 8,422,273 B2 | 4/2013 | Chang et al. |

(Continued)

OTHER PUBLICATIONS

K. Narasimhulu et al., "Impact of lateral asymmetric channel doping on deep submicrometer mixed-signal device and circuit performance," IEEE Transactions on Electron Devices, vol. 50, No. 12, 2003, pp. 2481-2489.

(Continued)

*Primary Examiner* — Anh D Mai
(74) *Attorney, Agent, or Firm* — Anthony Mauricio Pallone; Otterstedt & Kammer PLLC

(57) ABSTRACT

Channel engineering is employed to obtain a gate-all-around field-effect transistor having an asymmetric threshold voltage. A dual channel profile enables a steep potential distribution near the source side that enhances the lateral channel electric field and thus increases the carrier mobility.

8 Claims, 17 Drawing Sheets

(56) References Cited

U.S. PATENT DOCUMENTS

| | | |
|---|---|---|
| 8,637,871 B2 | 1/2014 | Anderson et al. |
| 8,901,659 B2 | 12/2014 | Sleight et al. |
| 9,287,360 B1 | 3/2016 | Basu et al. |
| 9,620,590 B1 | 4/2017 | Bergendahl |
| 9,640,666 B2 | 5/2017 | Peidous |
| 9,741,811 B2 | 8/2017 | Hatcher |
| 10,014,390 B1 | 7/2018 | Bouche et al. |
| 10,243,043 B2 | 3/2019 | Mochizuki |
| 10,403,739 B2 | 9/2019 | Kim |
| 10,535,733 B2 | 7/2020 | Cheng |
| 2013/0285019 A1* | 10/2013 | Kim ................. H01L 29/78 257/29 |
| 2015/0228775 A1 | 8/2015 | Yu et al. |
| 2017/0194430 A1 | 7/2017 | Wood |
| 2017/0207404 A1* | 7/2017 | Cao ................. H10K 10/464 |
| 2018/0175167 A1* | 6/2018 | Reboh ............... H01L 29/7848 |
| 2020/0105929 A1 | 4/2020 | Zhang |
| 2020/0251558 A1 | 8/2020 | Hashemi |

OTHER PUBLICATIONS

Ki-Ju Baek et al., "Device optimization of n-channel MOSFETs with lateral asymmetric channel doping profiles," Transactions on Electrical and Electronic Materials, vol. 11, No. 1, 2010, pp. 15-19.

J. Zhang et al., "High-k metal gate fundamental learning and multi-V t options for stacked nanosheet gate-all-around transistor," International Electron Devices Meeting (IEDM), 2017, pp. 22.1.1-22.1.4.

Paul J. Otterstedt, List of IBM Patents or Patent Applications Treated as Related, Dec. 31, 2021, 2 Pages.

* cited by examiner

GATE-ALL-AROUND FIELD-EFFECT TRANSISTOR HAVING SOURCE SIDE LATERAL END PORTION SMALLER THAN A THICKNESS OF CHANNEL PORTION AND DRAIN SIDE LATERAL END PORTION

CROSS REFERENCE TO RELATED APPLICATIONS

This application is a division of U.S. patent application Ser. No. 16/147,680 filed Sep. 29, 2018. The complete disclosure of the aforesaid U.S. patent application Ser. No. 16/147,680 filed Sep. 29, 2018 is expressly incorporated herein by reference in its entirety for all purposes.

BACKGROUND

The present invention relates generally to the electrical, electronic and computer arts and, more particularly, to gate-all-around transistors including asymmetric threshold voltages along the channels and the formation of such transistors.

With shrinking dimensions of various integrated circuit components, transistors such as field-effect transistors (FETs) have experienced dramatic improvements in both performance and power consumption. These improvements may be largely attributed to the reduction in dimensions of components used therein, which in general translate into reduced capacitance, resistance, and increased through-put current from the transistors. Metal oxide semiconductor field-effect transistors (MOSFETs) are well suited for use in high-density integrated circuits. As the size of MOSFETs and other devices decreases, the dimensions of source/drain regions, channel regions, and gate electrodes of the devices, also decrease.

Nanosheet FETs have been under development for possible use in tight pitch applications such as 7 nm nodes and beyond. Such FETs include multiple channel layers, each channel layer being separated by a gate stack including a layer of electrically conductive gate material and a gate dielectric layer. The gate stacks wrap around all sides of the channel layers, thereby forming a gate-all-around (GAA) structure. Epitaxial regions on the ends of the nanosheet channel layers form source/drain regions of the nanosheet FETs. Spacers are employed for electrically isolating the gates from the source/drain regions of nanosheet transistors.

A sequence of steps that may be employed during fabrication of a nanosheet transistor is shown in FIGS. 1A-1F. The structure 20 shown in FIG. 1A includes a stack of semiconductor layers including silicon layers 21 and silicon germanium layers 22 grown epitaxially in alternating sequence. The semiconductor layers can be formed on a substrate 23 such as a bulk semiconductor (e.g. silicon) substrate or a semiconductor-on-insulator substrate. As shown in FIG. 1B, dummy gates 24 and gate spacers 26 are formed on the top surface of the stack of semiconductor layers. The dummy gates 24 are typically amorphous silicon or polycrystalline silicon. Outer spacers 26 are formed on the dummy gates. A conformal silicon nitride layer may be deposited on the structure and patterned to form the outer spacers. The dummy gates 24 and outer spacers 26 protect the underlying portion of the stack of semiconductor layers while the exposed portions thereof are removed to form columns 25 of semiconductor nanosheets as shown in FIG. 1C. The silicon germanium layers 22 are undercut by a timed etch to form divots 27 between the silicon layers 21, as shown in FIG. 1D. A conformal dielectric layer, for example silicon nitride, is deposited on the structure, thereby filling the divots. The conformal dielectric layer is subjected to a timed etch to remove the dielectric material outside the divots. The remaining dielectric material forms inner spacers 28 between the silicon layers 21, as shown in FIG. 1D. Source/drain semiconductor material 29, for example doped silicon germanium, is then epitaxially grown on the exposed end portions of the silicon layers 21. A structure as shown in FIG. 1E is obtained at this stage of the process. A gate stack is formed later in the process between the channel layers (silicon layers 21) of the structure by removing the dummy gate and replacing it with gate materials such as high-k gate dielectric 30 and gate conductor metal 32. A structure as shown in FIG. 1F may be obtained.

A lateral asymmetric channel (LAC) doping profile, wherein the doping concentration of the source side is higher than that of the drain side in the channel, may enhance the electrical characteristics of MOSFETs. The channel potential transition at the source side channel regions is much steeper than those of the other channel regions while the device is operating due to non-uniform channel doping. Such a steep potential distribution near the source side enhances the lateral channel electric field and thus increases carrier mobility.

BRIEF SUMMARY

An exemplary method of fabricating a gate-all-around field-effect transistor having threshold voltage asymmetry includes obtaining a monolithic semiconductor structure including a vertical stack of nanosheet layers and sacrificial semiconductor layers, the nanosheet layers and the sacrificial semiconductor layers being arranged in alternating sequence. Each of the nanosheet layers includes a source side lateral end portion, a drain side lateral end portion, and a middle portion between and integral with the source side lateral end portion and the drain side lateral end portion. The source side lateral end portion and the drain side lateral end portion of each nanosheet layer extends laterally beyond the sacrificial silicon germanium layers. The monolithic structure further includes a dummy gate on the vertical stack and outer dielectric spacers adjoining the dummy gate. The source side lateral end portions of the nanosheet layers are thinned. Inner dielectric spacers are formed between the source side lateral end portions and between the drain side lateral end portions of the nanosheet layers. The method further includes epitaxially growing a source region and a drain region, respectively, on the source side lateral end portions and the drain side lateral end portions of the nanosheet layers.

An exemplary gate-all-around field-effect transistor includes a vertical stack of nanosheet layers, each of the nanosheet layers including a source side lateral end portion, a drain side lateral end portion, and a middle portion between and integral with the source side lateral end portion and the drain side lateral end portion. The source side lateral end portion has a smaller thickness than the middle portion and the drain side lateral end portion. A plurality of gate stacks is in alternating sequence with and operatively associated with the nanosheet layers. An epitaxial source region adjoins the source side lateral end portions of the nanosheet layers and is operatively associated with the nanosheet layers. An epitaxial drain region adjoins the drain side lateral end portions of the nanosheet layers and is operatively associated with the nanosheet channel layers. The nanosheet layers include channel regions between the epitaxial source regions and the epitaxial drain regions and are configured for providing threshold voltage asymmetry.

Techniques and structures as disclosed herein can provide substantial beneficial technical effects. By way of example only and without limitation, one or more embodiments may provide one or more of the following advantages:

Increased carrier mobility;

Allows gradient threshold voltage in a gate-all-around field-effect transistor without channel dopant diffusion variation;

Allows gradient threshold voltage in short channel devices;

Applicable to both nFET and pFET devices.

These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIG. 2I is a schematic, cross-sectional view thereof following etch back of the oxide portions of the inner spacers;

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention will be described herein in the context of illustrative embodiments. It is to be appreciated, however, that the specific embodiments and/or methods illustratively shown and described herein are to be considered exemplary as opposed to limiting. Moreover, it will become apparent to those skilled in the art given the teachings herein that numerous modifications can be made to the embodiments shown that are within the scope of the claims. That is, no limitations with respect to the embodiments shown and described herein are intended or should be inferred.

Figure 1A:
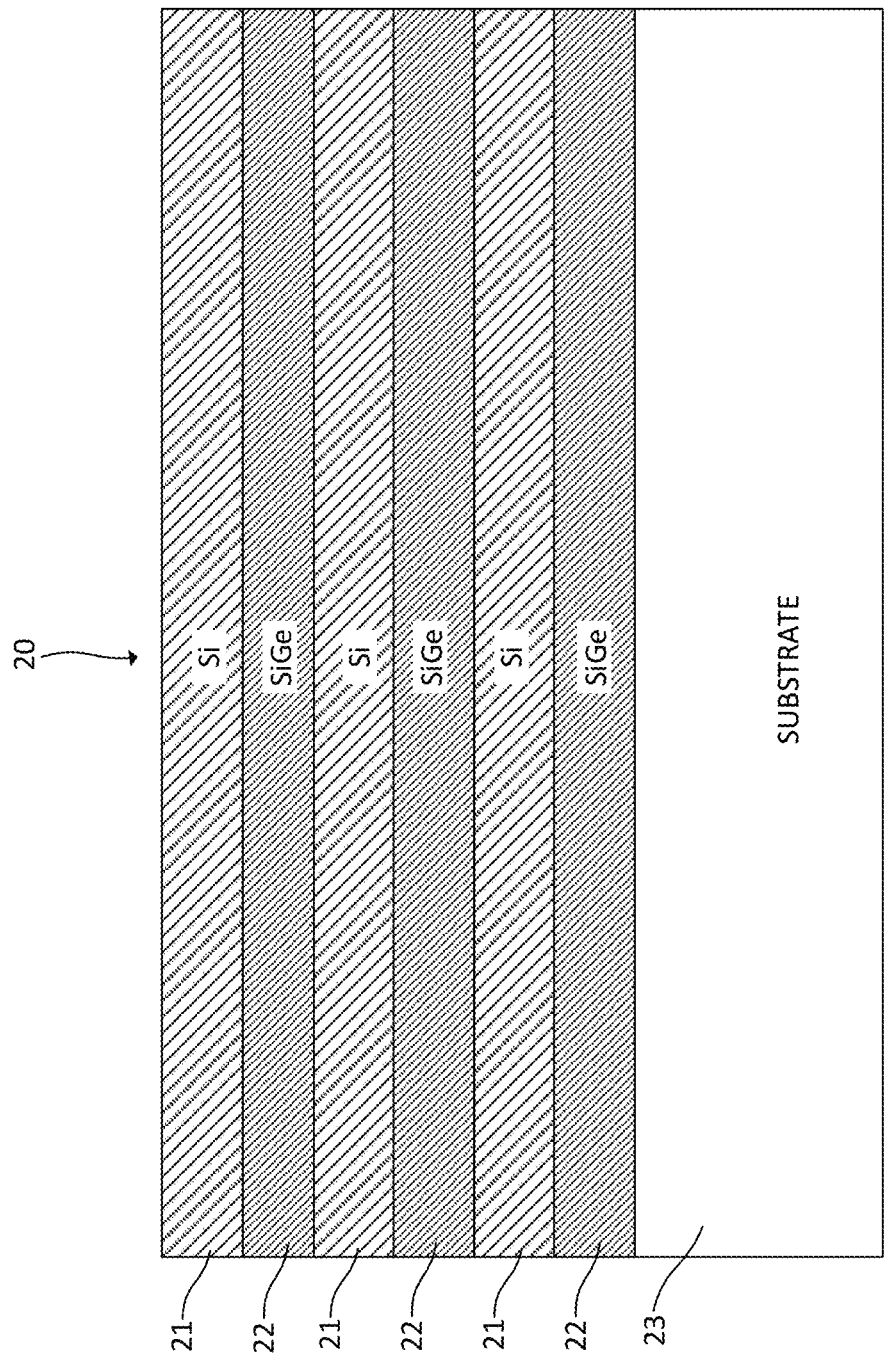
FIGS. 1A-1F are schematic, cross-sectional views showing sequential steps in a prior art process of fabricating a nanosheet field-effect transistor.
Figure 1B:
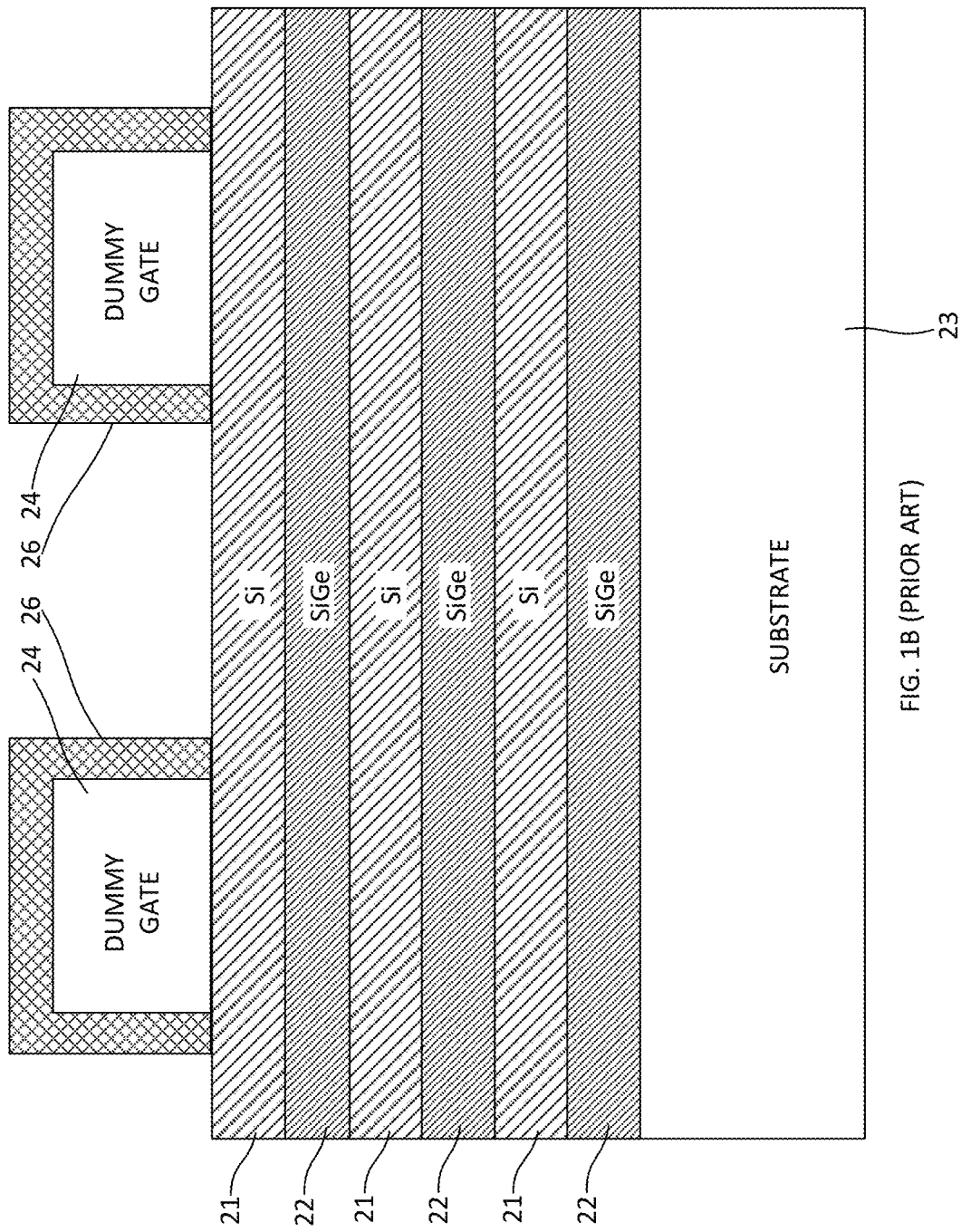
Figure 1C:
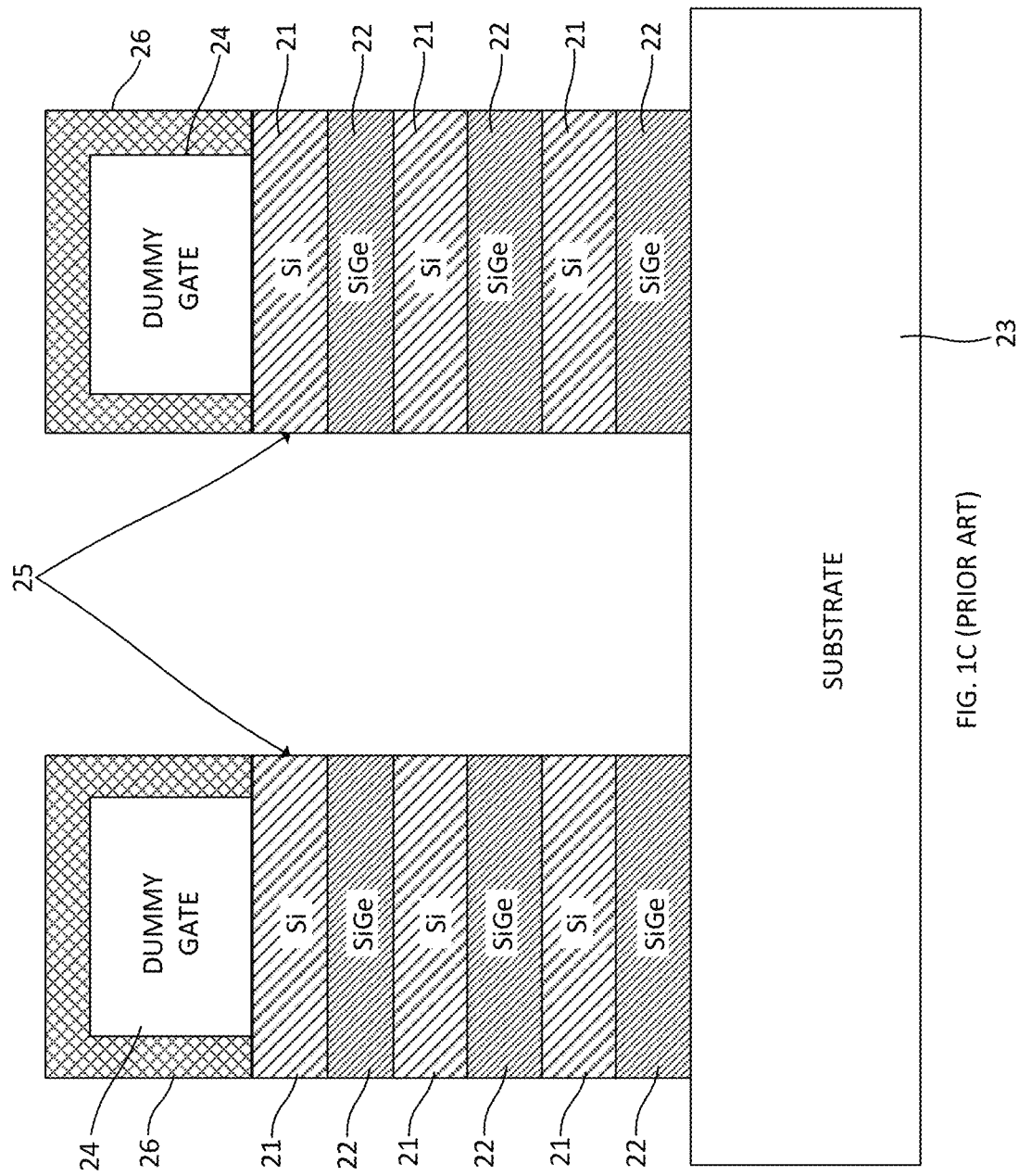
Figure 1D:
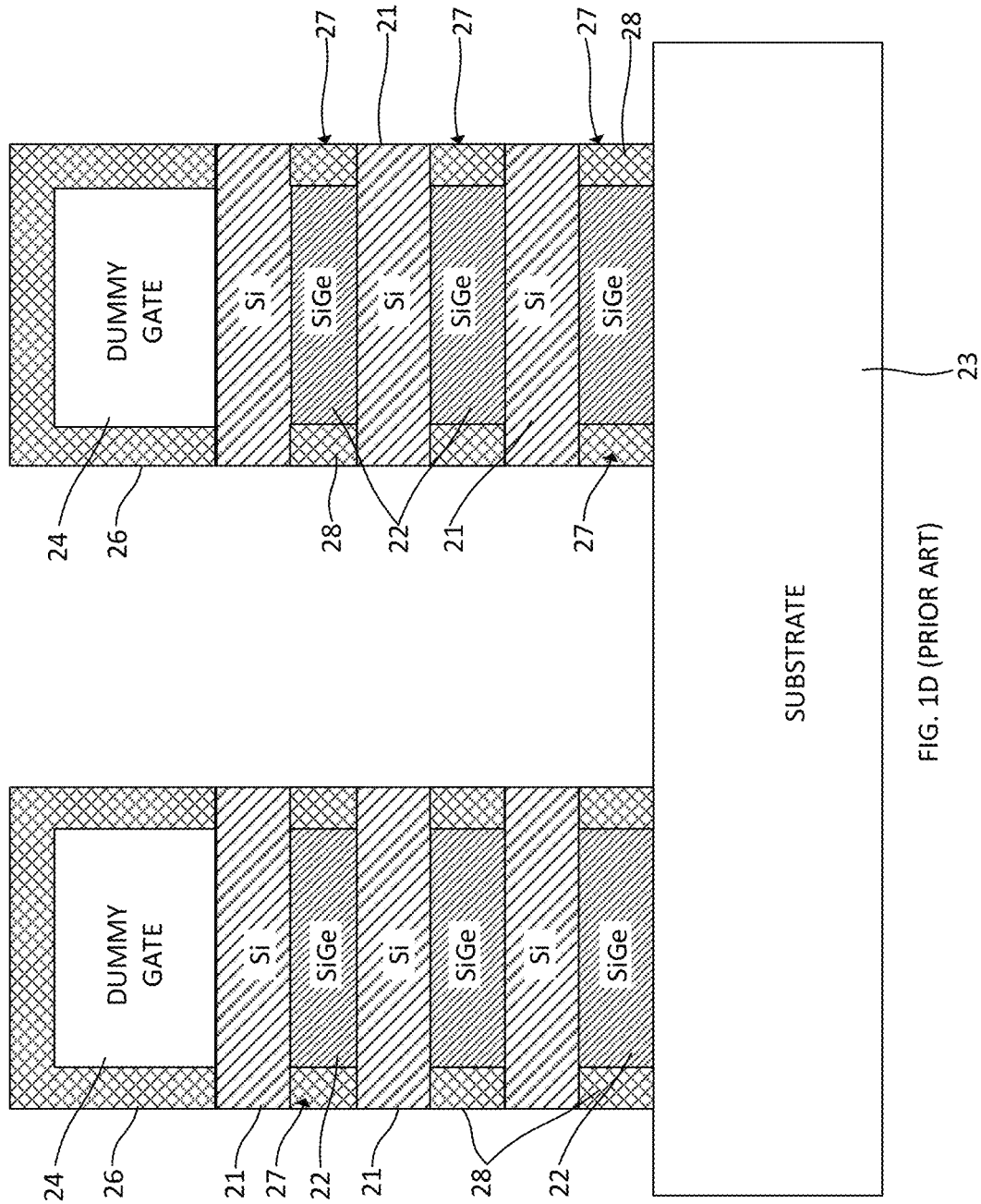
Figure 1E:
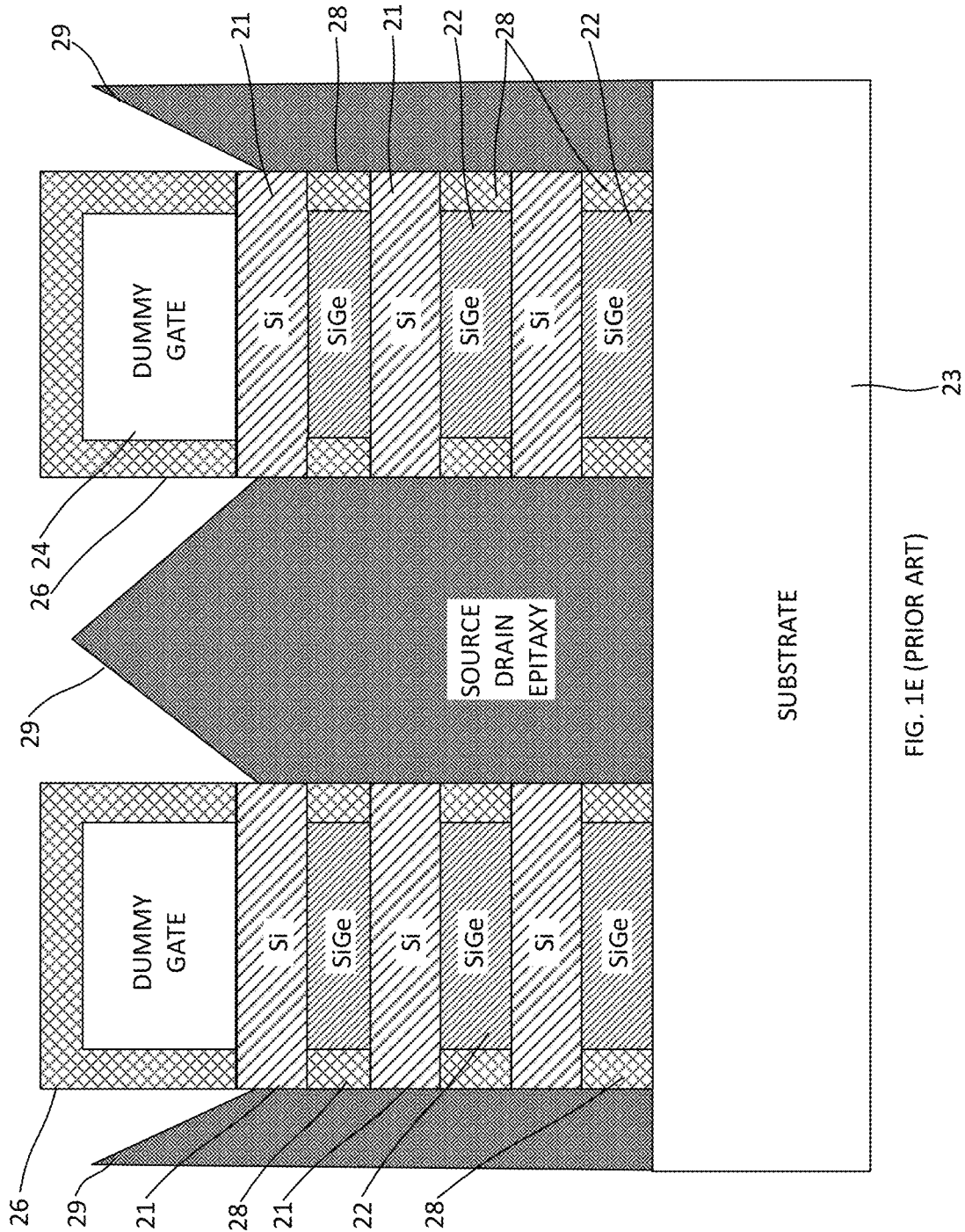
Figure 1F:
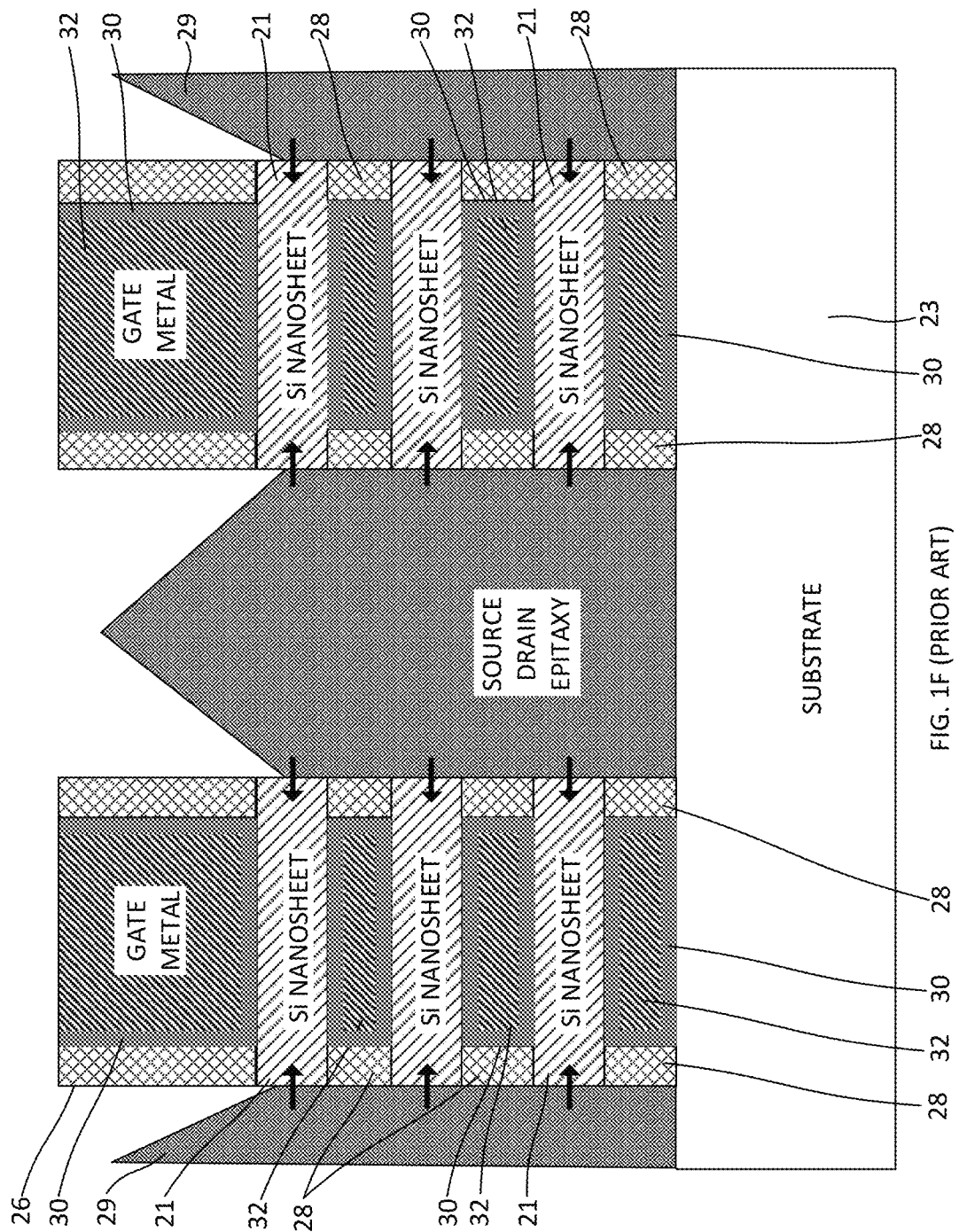
Figure 2A:
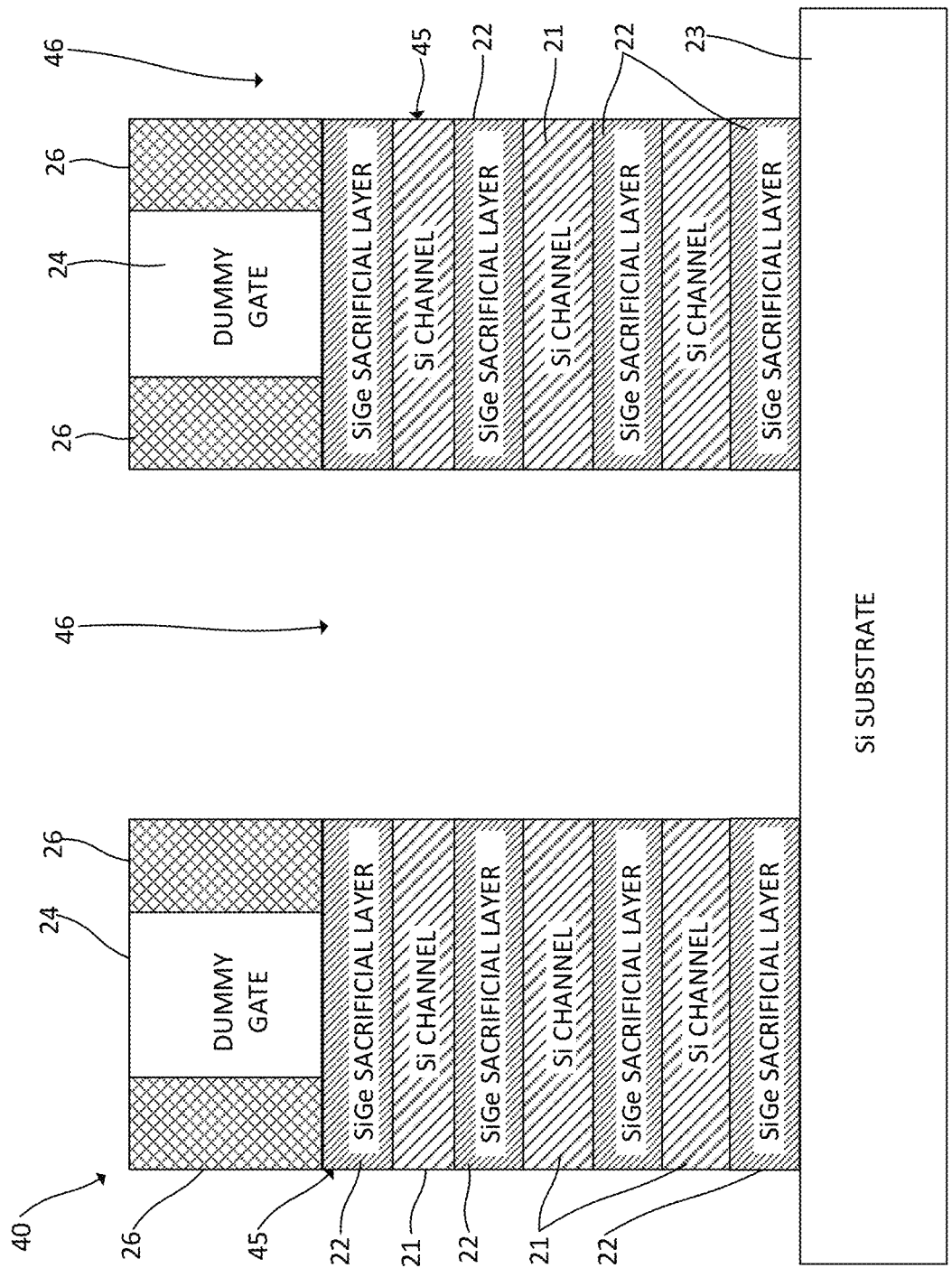
FIG. 2A is a schematic, cross-sectional view showing a monolithic structure including dummy gates and stacks of semiconductor nanosheets on a semiconductor substrate beneath the dummy gates.

An exemplary sequence of steps that may be employed during fabrication of a nanosheet transistor having an engineered channel profile is schematically illustrated in FIGS. 2A-2K. The monolithic semiconductor structure 40 shown in FIG. 2A is similar to that shown in FIG. 1C and can be obtained in substantially the same manner described above. The same reference numerals are employed to designate the same or substantially similar elements. The structure 40 includes vertical columns 45 separated by a trench 46, each column including a stack of epitaxial semiconductor nanosheet layers including, in alternating sequence, silicon layers 21 and silicon germanium layers 22. The silicon layers can be essentially undoped, though they may contain some impurities. The silicon layers function, at least in part, as channel regions of the gate-all-around field-effect transistors described below and may accordingly be referred to a channel layers. An amorphous silicon or polycrystalline silicon dummy gate 24 is on each column. Outer spacers 26 are formed on each dummy gate. The spacers 26 may consist essentially of a dielectric material such as silicon nitride or alternatively, for example, silicon oxynitride, SiBCN (silicon borocarbonitride), SiOCN (silicon oxycarbonitride), and/or SiOC (silicon oxycarbide).

In one or more exemplary embodiments, the epitaxial silicon nanosheet layers 21 each have a thickness in the range of four to ten nanometers (4-10 nm). The number of silicon nanosheet (channel) layers in the semiconductor layer stack may vary depending on the desired uses and capabilities of the nanosheet transistor to be fabricated. The silicon nanosheet layers 21 consist essentially of monocrystalline silicon in some embodiments. The silicon germanium layers 22, which are replaced by metal gate and gate dielectric materials later in the process, may have a thickness in the range of six to twenty nanometers (6-20 nm). The dimension ranges of the channel layers and sacrificial silicon germanium layers should be considered exemplary as opposed to limiting. The silicon germanium layers 22 may have the composition $Si_{1-x}Ge_x$ where x is between 0.2 and 0.8. The silicon and silicon germanium layers can be epitaxially grown in alternating sequence to obtain a vertical stack having the desired number of silicon (channel) layers.

The outer spacers 26 function as a hard mask during formation of the vertical columns 45. A reactive ion etch (RIE) down to the top surface of the substrate 23 may be employed to remove the semiconductor layers 21, 22 outside the outer spacers, thereby forming trenches 46. The portions of the semiconductor layers 21, 22 beneath the outer spacers 26 and dummy gates 24 remain essentially intact, as illustrated in FIG. 2A.

Figure 2B:
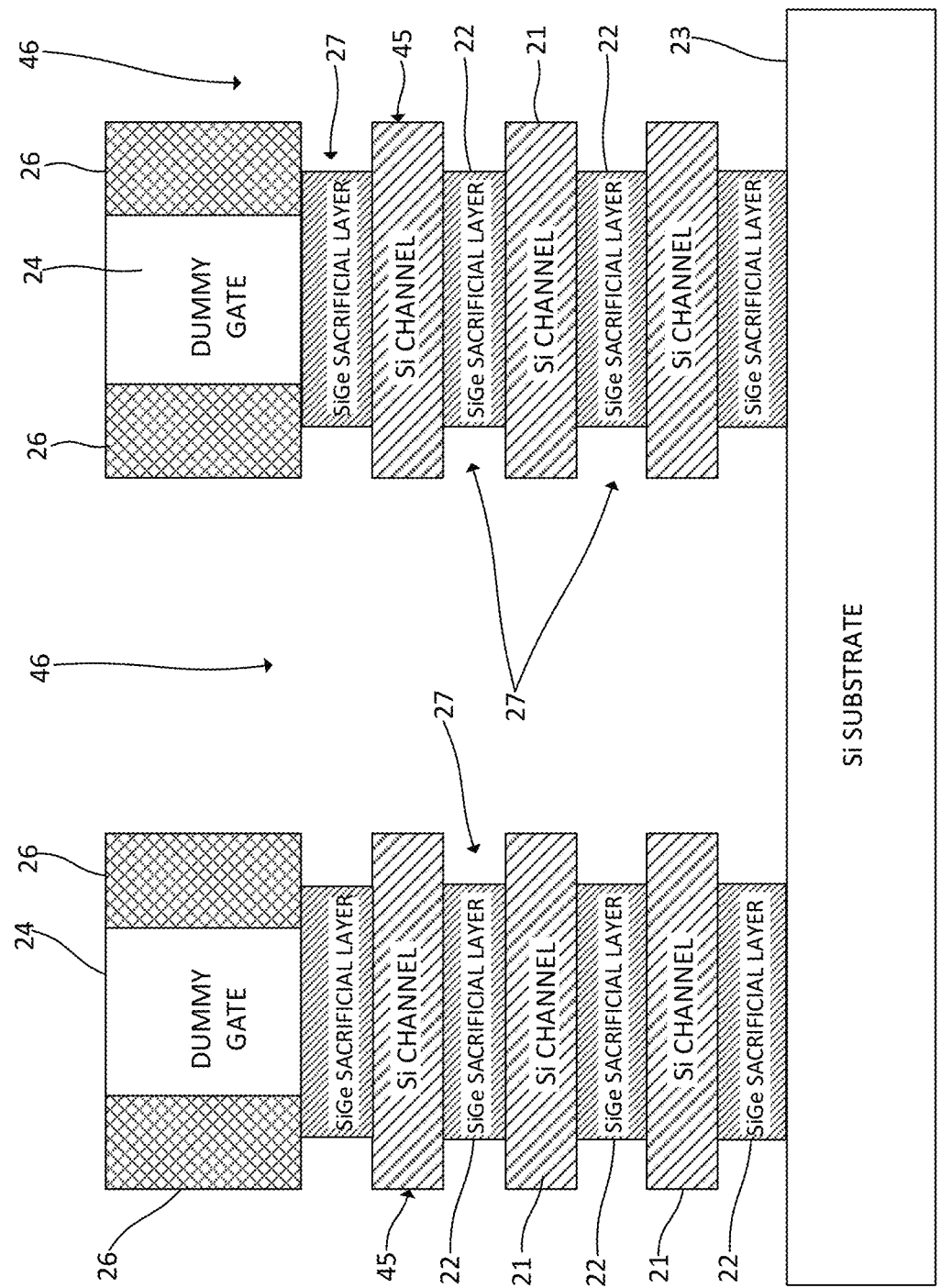
FIG. 2B is a schematic, cross-sectional view showing the structure following selective etch back of silicon germanium sacrificial layers.

Referring to FIG. 2B, the silicon germanium sacrificial layers 22 are selectively etched back to reduce the widths thereof. The silicon germanium layers 22 are etched using an etching process that is selective to the silicon nanosheets 21 to form divots 27 in the vertical columns 45. Hydrogen chloride gas is employed in some embodiments to selectively remove exposed edge portions of the silicon germanium layers, leaving the silicon nanosheets 21 substantially intact. Alternatively, a timed wet etch process containing ammonia and hydroperoxide can be used to etch SiGe selective to other materials. Etch-back is discontinued once the widths of the silicon germanium layers have been sufficiently reduced. Following etch-back, each of the silicon nanosheets 21 may extend about four to ten nanometers (4-10 nm) laterally beyond each of the ends of the sacrificial silicon germanium layers 22.

Figure 2C:
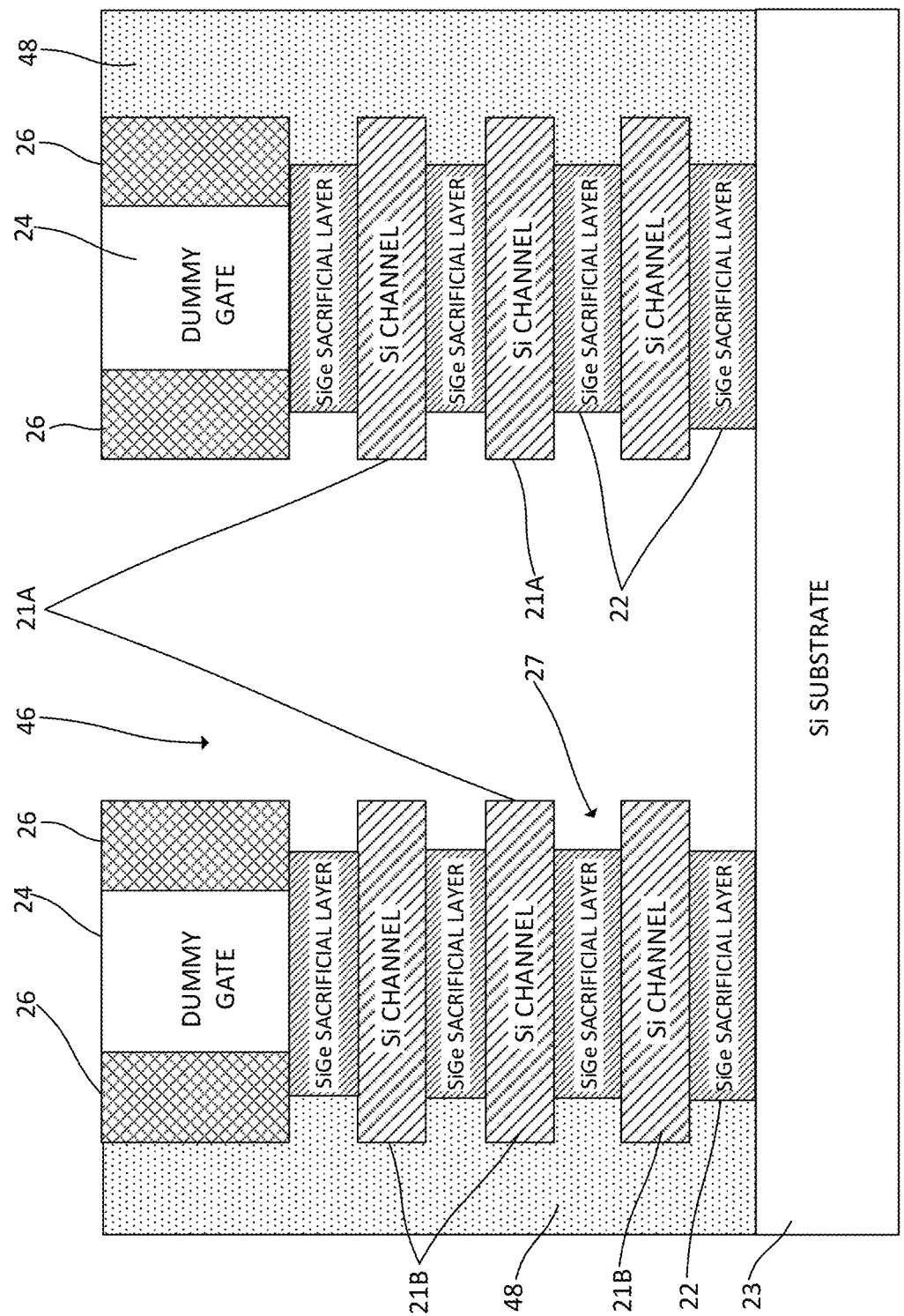
FIG. 2C is a schematic, cross-sectional view thereof following deposition and patterning of a mask layer on the structure shown in FIG. 2B.

An organic planarization layer (OPL) 48 is deposited and patterned to protect the drain sides of the stacks 45 and expose the source sides thereof. As schematically illustrated in FIG. 2C, the trenches adjoining the drain sides of the vertical columns 45 are filled by the OPL layer. The trenches adjoining the source sides of the vertical columns are open. The silicon nanosheets include first end portions 21A extending into the trench 46 on the source sides of the vertical columns and second (drain side) end portions 21B that are embedded within the OPL layer. The middle portion of each of the silicon nanosheets 21 adjoins at least one of the silicon germanium sacrificial layers.

Figure 2D:
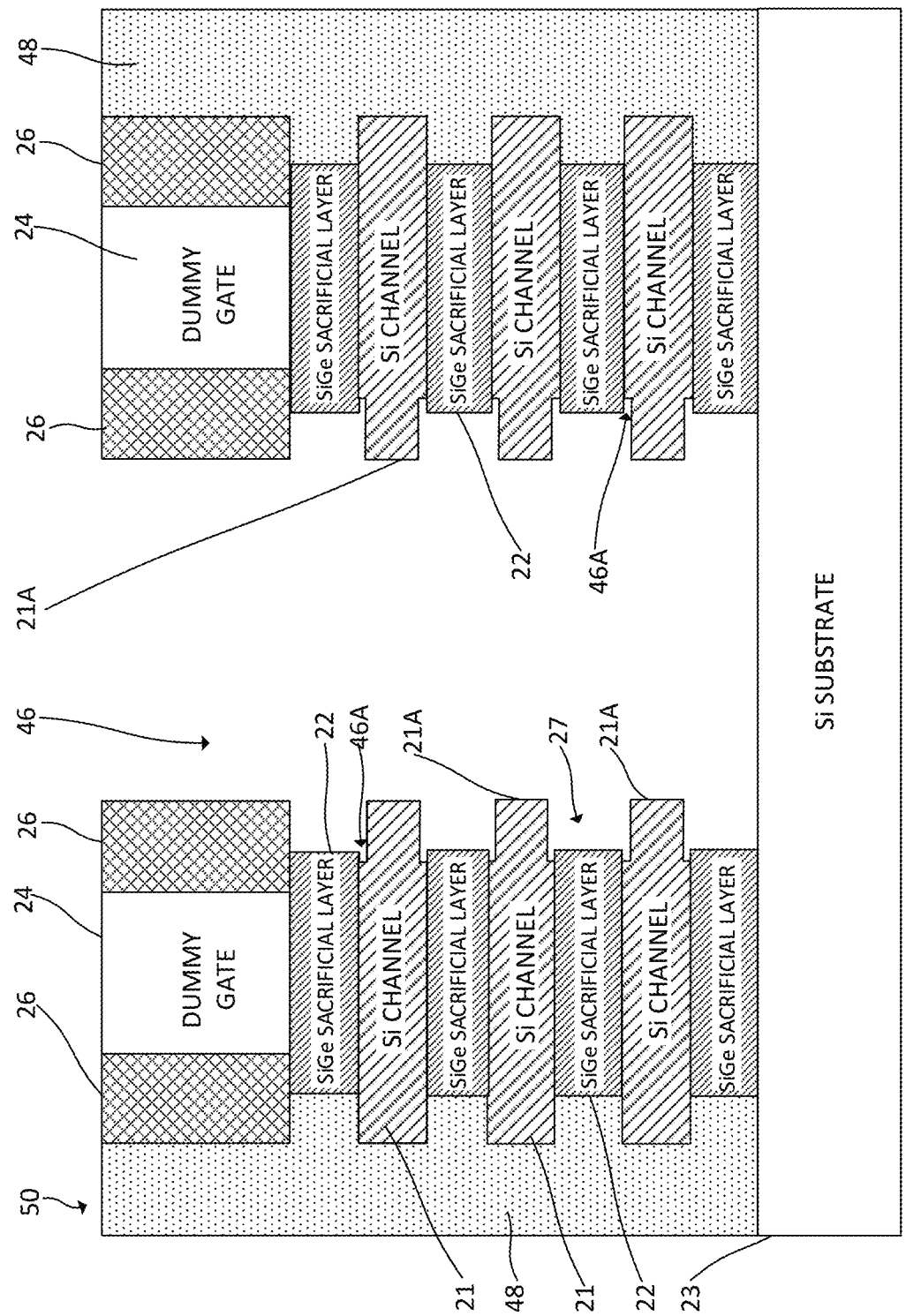
FIG. 2D is a schematic, cross-sectional view thereof following thinning of the channel layers within the stacks of semiconductor nanosheets.
Figure 2E:
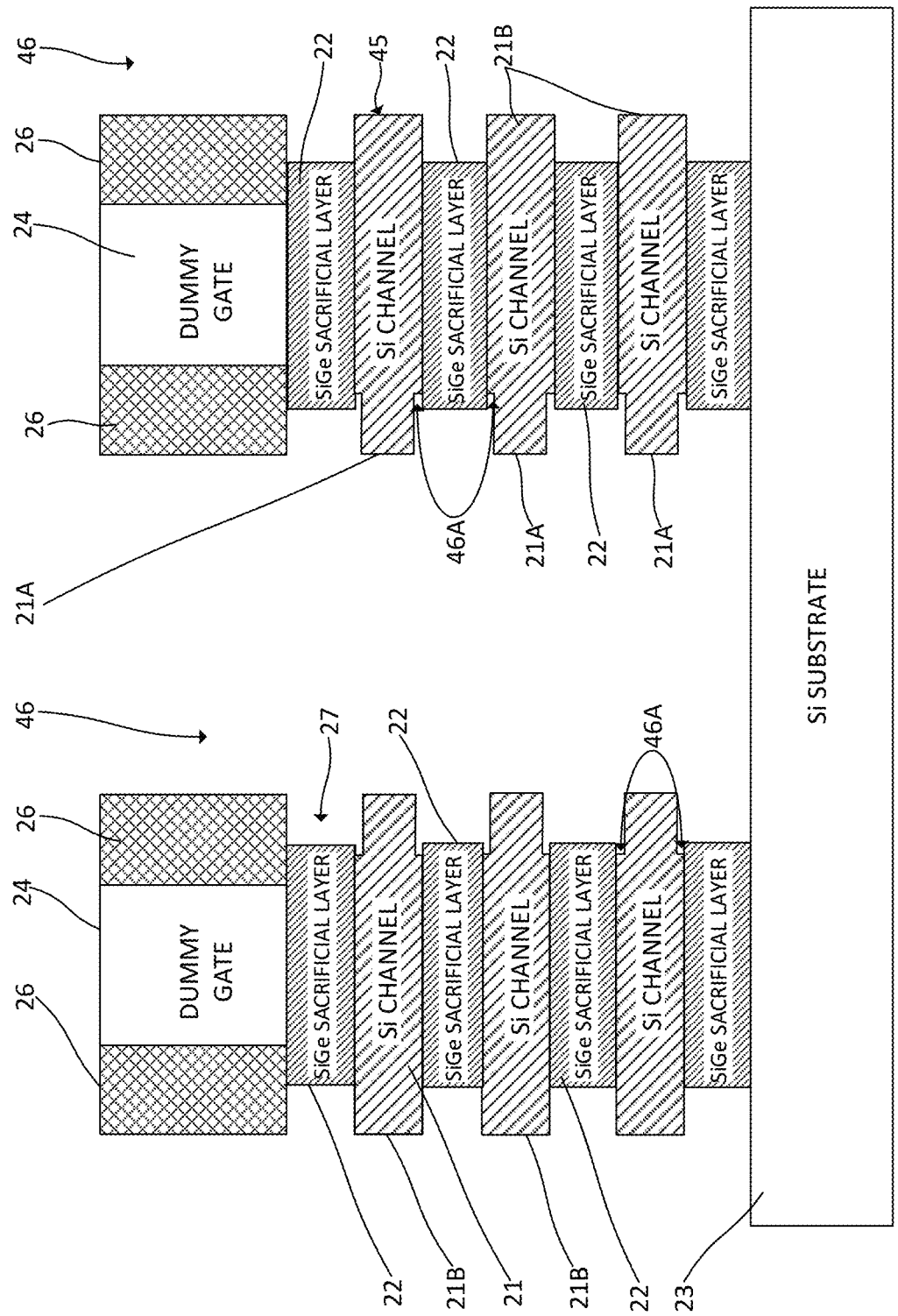
FIG. 2E is a schematic, cross-sectional view thereof following removal of the patterned mask.

The thicknesses of the exposed end portions 21A on the source sides of the silicon nanosheets 21 are reduced to obtain a structure 50 as schematically illustrated in FIG. 2D. The monolithic structure shown in FIG. 2C can be subjected to a timed anisotropic wet etching process to selectively thin the end portions 21A of the silicon nanosheets 21. Such a process may employ TMAH (tetramethyl ammonium hydroxide) or ammonia ($NH_4OH$). Thinning of the silicon nanosheets 21 is discontinued once the thicknesses of the end portions 21A have been sufficiently reduced to obtain the desired gradient threshold voltage ($V_t$) for the finished devices. In an exemplary embodiment where the original average thickness of each silicon nanosheet 21 is, for example, between four to twelve nanometers (4-12 nm), the average thickness of the thinned end portions 21A of the nanosheets on the source sides of the vertical columns 45 is three to ten nanometers (3-10 nm). The process of thinning the silicon nanosheet layers further causes the lateral recessing thereof between the silicon germanium sacrificial layers 22, forming small recesses 46A between the silicon and silicon germanium layers of the structure 50. The overall distances between lateral ends of the silicon nanosheets 21 may also be slightly reduced as the end portions 21A on the source sides are etched on all exposed surfaces. The resulting silicon nanosheets 21 have a stepped configuration including a relatively thick main portion that extends between the silicon germanium sacrificial layers and within the OPL layer 48 and relatively narrow end portions 21A extending into the trenches 46 in which source regions are later epitaxially grown. The thickness of each nanosheet portion is essentially uniform in one or more embodiments, the main portion being of greater thickness than the thinned end portion. Thinning the source side lateral end portions 21A of the nanosheet layers forms stepped nanosheet layers 21, each of the stepped nanosheet layers including top and bottom steps between the source side lateral end portion and the middle portion thereof. The OPL layer is removed to again expose the end portions 21B of the silicon nanosheets extending from the drain sides of the vertical columns 45, as shown in FIG. 2E. The drain side lateral end portions 21B remain at their original thicknesses.

Figure 2F:
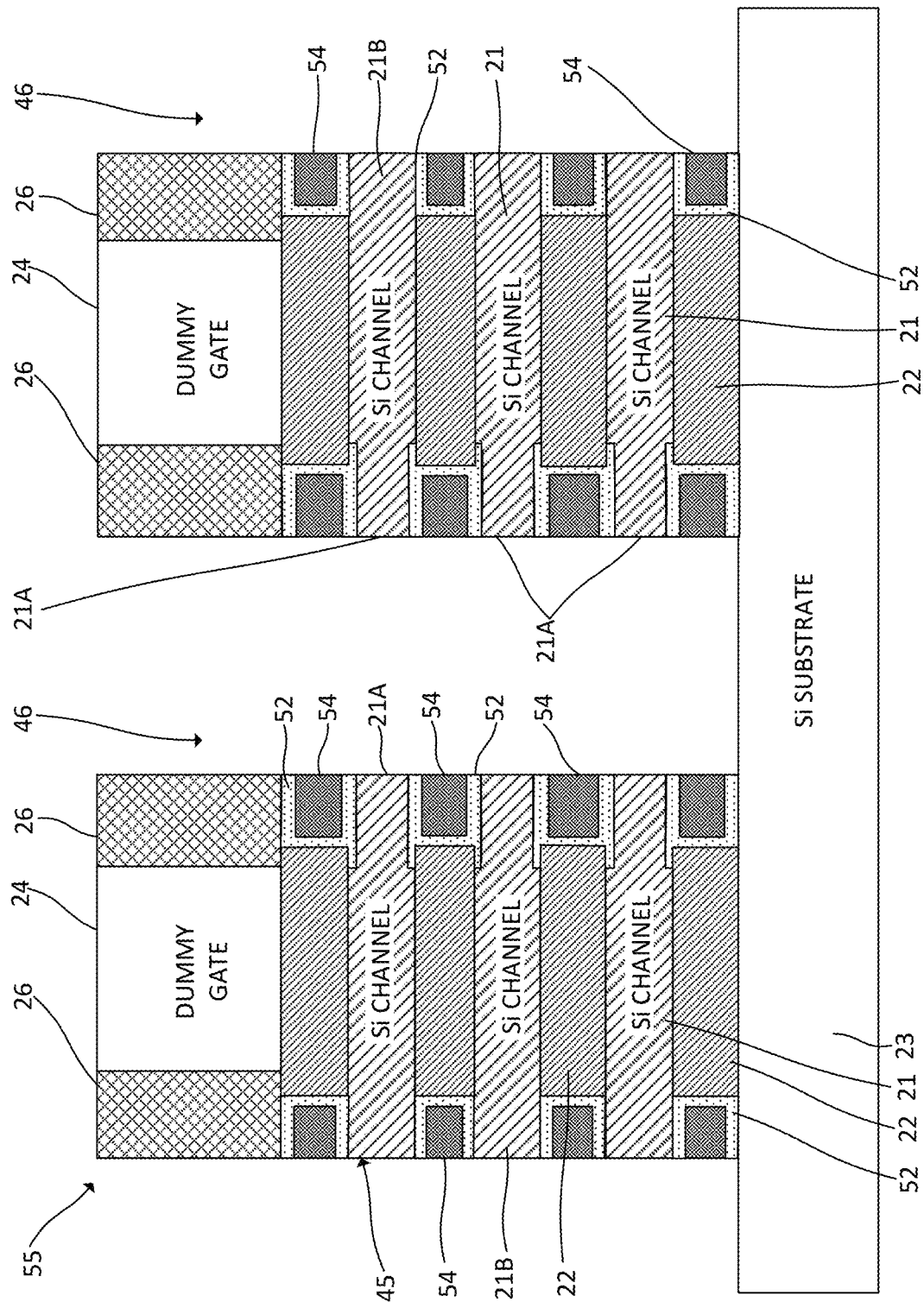
FIG. 2F is a schematic, cross-sectional view thereof following inner spacer deposition.

Inner spacers are formed on the vertical columns to fill the divots 27. In an exemplary embodiment, the inner spacers comprise oxide and nitride layers 52, 54 as shown in FIG. 2F. The oxide layer 52 may be formed using any suitable conformal deposition process. A conformal dielectric layer such as a silicon nitride layer is then deposited on the structure, thereby filling the oxide-lined divots in the vertical columns 45. The conformal dielectric layers are subjected to an etching process to remove the dielectric material from the trenches 46 and outside the stacks of semiconductor layers. The remaining dielectric material forms inner spacers (52, 54) in the divots 27 between the end portions 21A, 21B of the silicon layers 21. The lateral end surfaces of the silicon nanosheets 21 are exposed in the resulting structure.

Source and drain regions 56A, 56B are epitaxially grown on the exposed lateral surfaces of the silicon nanosheet layers 21. The terms "epitaxially growing and/or depositing" and "epitaxially grown and/or deposited" mean the growth of a semiconductor material on a deposition surface of a semiconductor material in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

Dopants may be incorporated in situ during growth of the source and drain regions using appropriate precursors, as known in the art. By "in-situ" it is meant that the dopant that dictates the conductivity type of a doped layer is introduced during the process step, for example epitaxial deposition, that forms the doped layer. As used herein, the term "conductivity type" denotes a dopant region being p-type or n-type. As used herein, "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium. As used herein, "n-type" refers to the addition of impurities that contribute free electrons to an intrinsic semiconductor. In a silicon-containing substrate, examples of n-type dopants, i.e., impurities, include but are not limited to antimony, arsenic and phosphorous. Exemplary epitaxial growth processes that are suitable for use in forming silicon and/or silicon germanium epitaxy include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The epitaxial process is selective to dielectric materials such as silicon nitride, so the epitaxial material does not grow on the spacers 26, 52/54.

In some embodiments, the dopants may include, for example, a p-type dopant selected from a group of boron (B), gallium (Ga), indium (In), and thallium (Tl) at various concentrations. For example, in a non-limiting example, a dopant concentration range may be low $e20/cm^3$ to mid-$e21/cm^3$, with $4e20/cm^3$ to $1e21/cm^3$ preferred. The source and drain regions can include silicon germanium (SiGe) in one or more embodiments. In embodiments wherein pFET devices are formed, the source and drain regions may consist essentially of SiGe:B. For nFET devices, both the source and drain regions (and doped extension regions possibly formed in the nanosheet end portions 21A, 21B) may consist essentially of Si:P. Relatively high $V_t$ is provided near the source side where the silicon nanosheet channel layers are thinned.

The epitaxial deposition process may employ the deposition chamber of a chemical vapor deposition type apparatus, such as a low pressure chemical vapor deposition (LPCVD) apparatus. A number of different precursors may be used for the epitaxial deposition of the in situ doped semiconductor material. In some embodiments, the gas source for the deposition of an epitaxially formed in situ doped semiconductor material may include silicon (Si) deposited from silane, disilane, trisilane, tetrasilane, hexachlorodisilane, tetrachlorosilane, dichlorosilane, trichlorosilane, disilane and combinations thereof. A germanium gas source may, for example, be selected from the group consisting of germane, digermane, halogermane, dichlorogermane, trichlorogermane, tetrachlorogermane and combinations thereof. The temperature for epitaxial silicon germanium deposition typically ranges from 450° C. to 900° C. Although higher temperature typically results in faster deposition, the faster deposition may result in crystal defects and film cracking. Examples of other epitaxial growth processes that can be employed in growing source and drain regions 56A, 56B described herein include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). It may be necessary to remove thin oxide from the edges of the silicon nanosheet layers 21 so that the exposed silicon edges can be used as the seed to epitaxially grow the source and drain regions. Before epitaxial growth, an oxide etch process may be employed to clean the semiconductor surface.

Figure 2G:
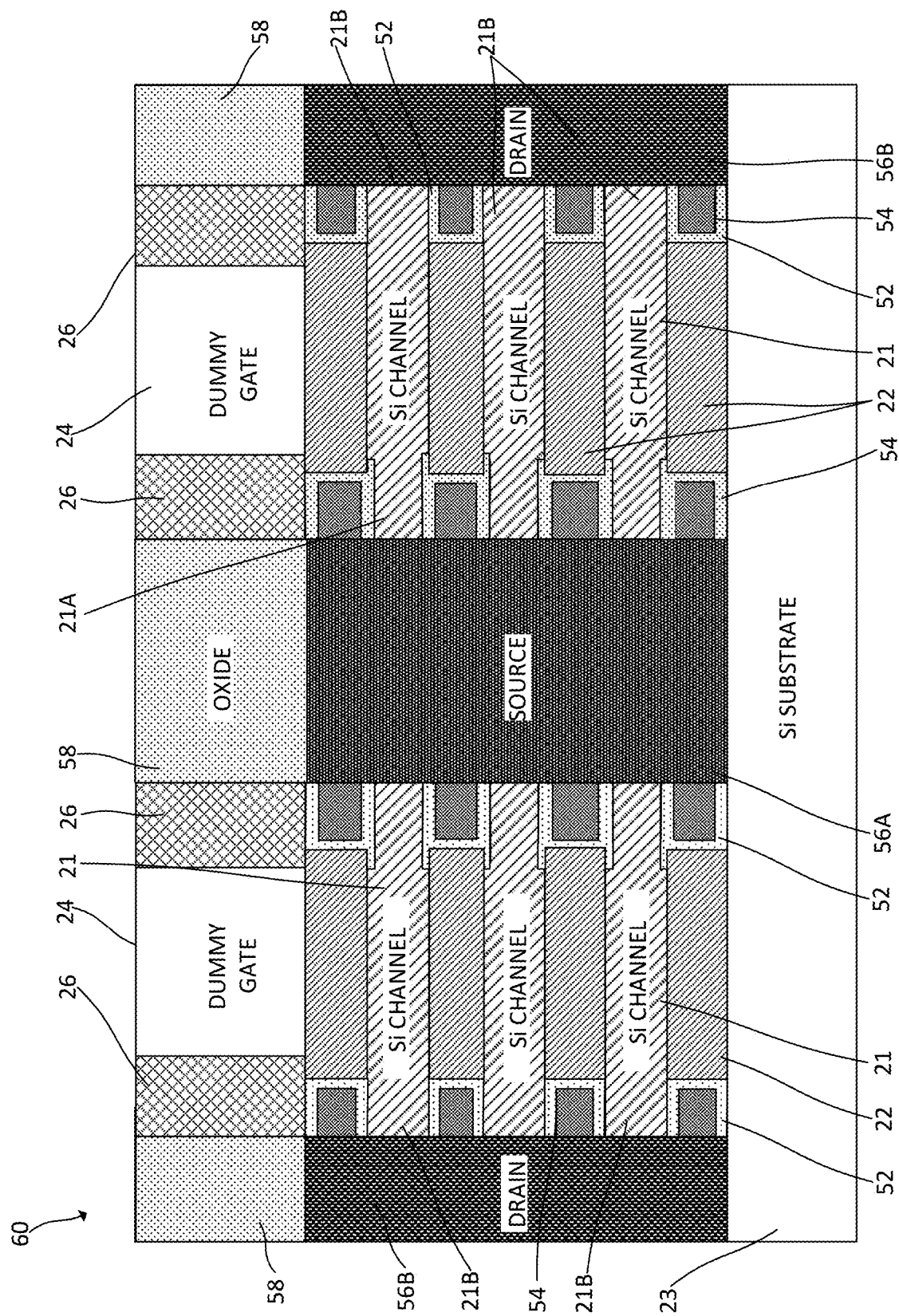
FIG. 2G is a schematic, cross-sectional view thereof following epitaxial source/drain formation and deposition of an oxide fill.

An interlevel dielectric (ILD) layer 58 is deposited on the structure and planarized. The ILD layer 58 may be formed from any suitable dielectric material, including but not limited to spin-on-glass, a flowable oxide, a high density plasma oxide, borophosphosilicate glass (BPSG), or any combination thereof. The ILD layer is deposited by any suitable deposition process including but not limited to CVD, PVD, plasma-enhanced CVD, atomic layer deposition (ALD), evaporation, chemical solution deposition, or like processes. The ILD layer is planarized using chemical mechanical planarization (CMP) down to the dielectric outer spacers 26. It accordingly protects the source and drain regions 56A, 56B during subsequent process steps. FIG. 2G illustrates an exemplary structure 60 following epitaxial source and drain formation and ILD deposition.

Figure 2H:
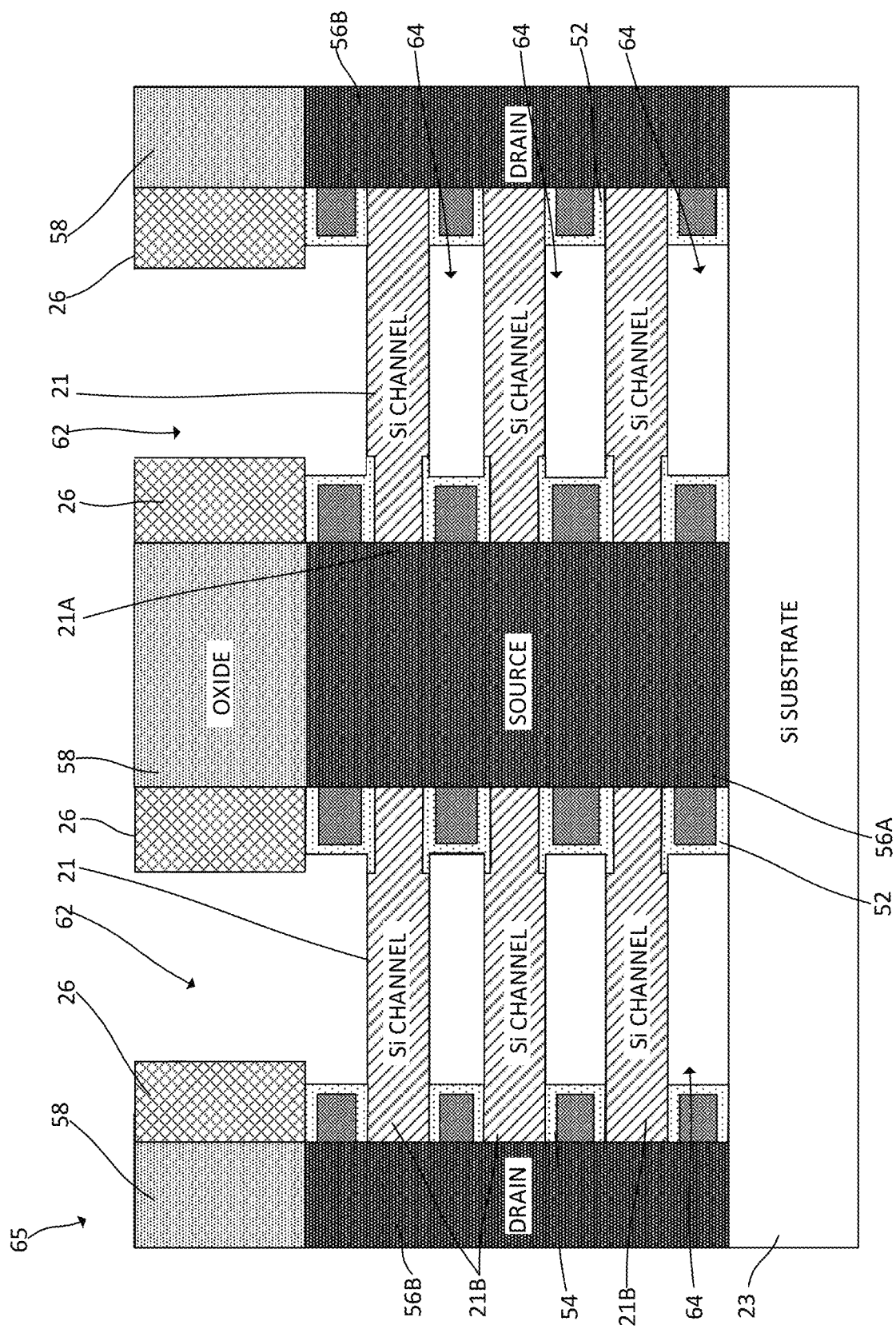
FIG. 2H is a schematic, cross-sectional view thereof following dummy gate removal and removal of sacrificial nanosheets.
Figure 21:
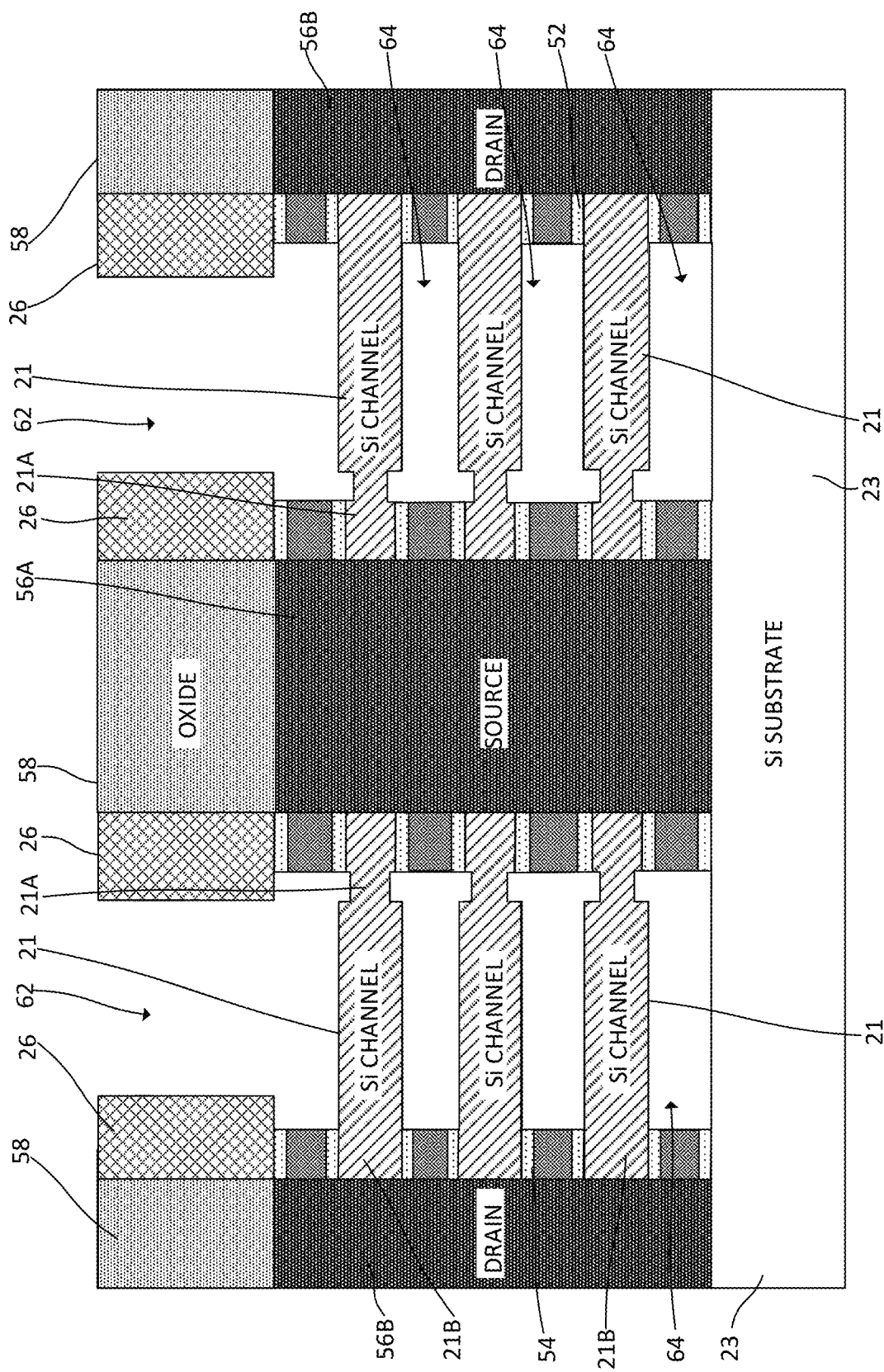

A poly open CMP (POC) process is then employed to selectively remove the sacrificial material comprising the dummy gates 24 while leaving the spacers 26 intact. Trenches 62 bounded by the spacers 26 are accordingly formed. Once the dummy gates 24 are removed, the silicon germanium layers 22 are removed using an etching process that is selective to the silicon nanosheets 21. Hydrogen chloride gas is employed in some embodiments to selectively remove silicon germanium, leaving the silicon nanosheets 21 substantially intact. Alternatively, a wet etch process containing ammonia and hydroperoxide can be used to etch SiGe selective to other materials. As shown in FIG. 2H, horizontal spaces 64 are formed between the silicon (channel) nanosheet layers 21 as well as between the bottom silicon nanosheet layer 21 and the substrate 23. The etch is also selective to the dielectric inner spacers 52/54. The inner spacers help isolate the source and drain regions 56A, 56B from the etchant. Erosion of the source and drain regions 56A, 56B during silicon germanium nanosheet removal is accordingly avoided. A structure 65 as schematically illustrated in FIG. 2H may be obtained.

Referring to FIG. 2I, the oxide portions of the inner spacers 52/54 are etched back, thereby laterally expanding the spaces 64 between nanosheet layers 21. Oxide removal is conducted using, for example, a SiCoNi™ vapor phase etch process. A SiCoNi™ etch is a plasma-assisted dry etch process that involves simultaneous exposure of a substrate to hydrogen, NF$_3$ and NH$_3$ plasma by-products. Oxide etch processes other than SiCoNi™ vapor phase etch process can be used, for example, a wet etch using a solution containing hydrofluoric acid. The etching of the oxide material partially exposes the stepped (thinned) portions of the silicon nanosheet layers on the source sides of the nanosheet layers 21. The stepped portions 21A of the silicon nanosheet layers exposed by such etching may or may not be further thinned during etch-back of the oxide portions of the inner spacers. Portions of the oxide layer 52 remain between the nitride portions of the inner spacers and the outer portions 21A, 21B of the nanosheet layers 21 following the oxide etch back process.

Figure 2J:
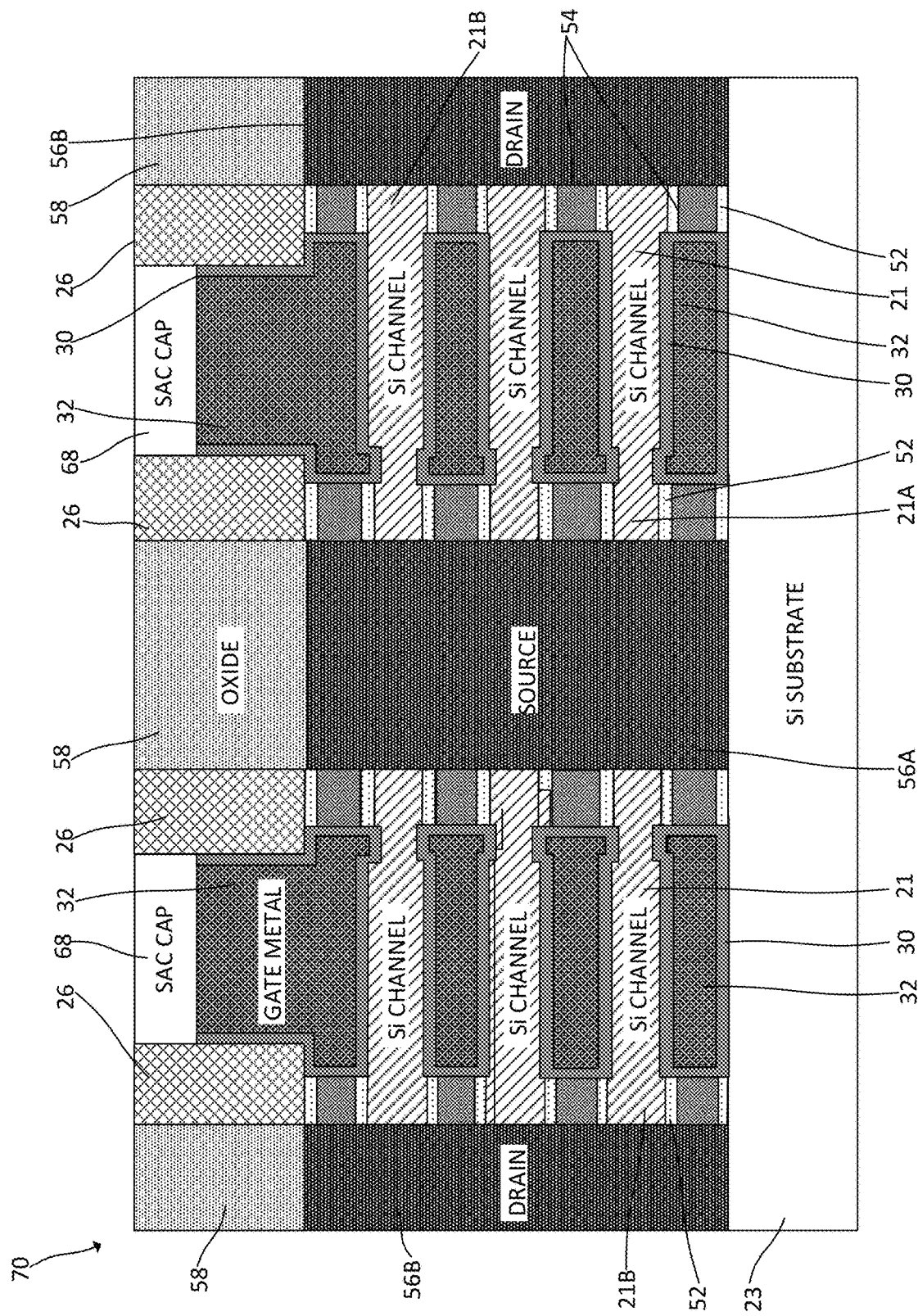
FIG. 2J is a schematic, cross-sectional view thereof following gate formation.

Gate stacks are formed in adjoining relation to the silicon nanosheet (channel) layers 21, thereby obtaining a monolithic structure 70 as schematically illustrated in FIG. 2J. A gate dielectric layer 30 forms portions of the gate stacks that replace the previously removed sacrificial silicon germanium layers 22. The gate stacks adjoin the channel regions of the silicon nanosheet layers 21, the inner spacers 52/54 and the outer spacers 26. Non-limiting examples of suitable materials for the gate dielectric layer 30 include oxides, nitrides, oxynitrides, silicates (e.g., metal silicates), aluminates, titanates, nitrides, or any combination thereof. Examples of high-k gate dielectric materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as, for example, lanthanum and aluminum. The gate dielectric layer 30 may be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the gate dielectric material may vary depending on the deposition process as well as the composition and number of high-k dielectric materials used. In some embodiments, the gate dielectric layer 30 includes multiple layers.

Electrically conductive gate material is deposited in the trenches 62 formerly containing the dummy gates 24 and the spaces 64 formerly filled by the silicon germanium layers 22. The deposited metal gate material forms the metal gate 32 of the nanosheet field-effect transistor. As shown in FIG. 2J, the deposited gate material additionally forms a gate electrode portion within the outer spacers 26 that extends vertically above the stack of nanosheet channel layers. Non-limiting examples of suitable electrically conductive metals for forming the metal gate include aluminum (Al), platinum (Pt), gold (Au), silver (Ag), tungsten (W), titanium (Ti), cobalt (Co), or any combination thereof. The gate metal may be deposited using processes such as CVD, PECVD, PVD, plating, or thermal or e-beam evaporation. A planarization process, for example, chemical mechanical planarization (CMP), is performed to polish the top surface of the deposited gate metal material that may form on the structure.

In some embodiments, the electrically conductive gate includes a work function metal (WFM) layer disposed between the gate dielectric layer and another electrically conductive metal gate material. The WFM layer may include multiple WFM layers made from different materials. The WFM sets the transistor characteristics such as threshold voltage ($V_t$) to a predetermined value. In some embodiments, the WFM serves dual purposes: $V_t$ setting and gate conductor. The smaller channel thickness at the source end of each channel layer contributes to a higher $V_t$. The larger suspension gaps at the source side channel ends will cause WFM thickness differences that can also increase $V_t$. Due to spacing limitations between nanosheet layers 21, WFM deposition is self-limiting. WFM thickness between channel regions will accordingly vary due to differences in spacing between the channel regions.

Threshold voltage can be modulated through WFM thickness as well as the inter-nanosheet (channel) spacing. Non-limiting examples of suitable work function metals include p-type work function metal materials and n-type work function metal materials. P-type work function materials include compositions such as ruthenium, palladium, platinum, cobalt, nickel, and conductive metal oxides, titanium nitride, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) may be deposited by a suitable deposition process, for example, a conformal ALD process. The nanosheet FET structure at this stage of the exemplary fabrication process includes nanosheet channel regions, operatively associated gate stacks (30, 32), doped epitaxial source and drain regions 56A, 56B, and possibly doped extension regions (not shown) between the channel regions of the nanosheet layers 21 and the source/drain regions.

One end portion of the gate metal formed in each space 64 has relatively greater thickness due to the stepped configurations of the channel regions of the silicon nanosheet layer(s) 21 which it surrounds. As illustrated in FIG. 2J, the channel regions of the silicon nanosheet layers 21 that adjoin the gate stacks include relatively thick main portions and relatively thin end portions. The relatively thin end portions of the channel regions are integral with the lateral ends of the nanosheet layers 21 between inner spacers on the source sides thereof. The relatively thick main portions of the silicon nanosheet layers 21 are integral with the drain sides of the layers 21 bounded by the inner spacers 52/54. The relatively thick main portions of the nanosheet layers 21 and the drain side end portions have the same thicknesses in the exemplary embodiment. The relatively thin end portions of the channel regions may have the same thicknesses as the nanosheet layer end portions bounded by the inner spacers 52/54 on the source side or be slightly thinner than such nanosheet portions. The relatively thick main portions of the channel regions of the nanosheet layers 21 are substantially longer than the relatively thin end portions thereof.

Figure 2K:
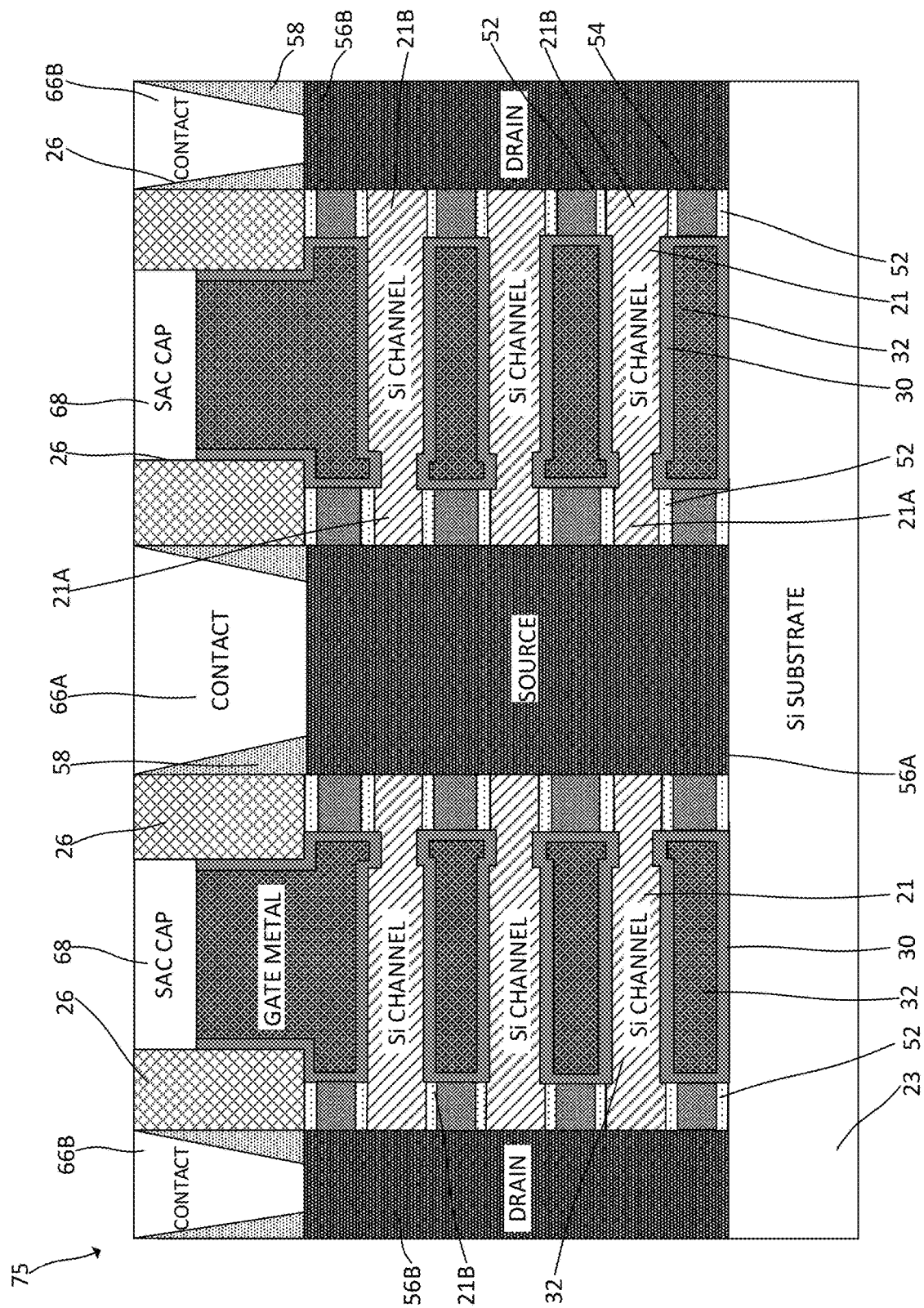
FIG. 2K is a schematic, cross-sectional view thereof following source/drain contact formation.

Drain contacts 66B and source contacts 66A are formed to obtain a structure 75 as shown in FIG. 2K. An insulator (SAC) cap 68 is formed on the top surface of each gate electrode prior to forming source/drain contacts. The insulator cap 68 can be formed by recessing the gate electrode, depositing an electrical insulator, and planarizing the electrical insulator. The source/drain contacts are formed any suitable patterning and metallization processes. For example, a mask can be used to open the areas where source and drain contacts are needed. Electrically conductive material(s) can then be deposited in the trenches followed by planarization to form source and drain contacts. Selected portions of the ILD layer 58 can be removed by any suitable etch process. For example, it can be removed by RIE containing $CHF_3$/Ar plasma. The ILD material within the vertical trenches above the source and drain regions is removed. Contact material may, for example, include tantalum (Ta), aluminum (Al), platinum (Pt), gold (Au), tungsten (W), titanium (Ti), cobalt (Co) palladium (Pd) or any combination thereof. The contact material may be deposited by, for example, CVD, PECVD, PVD, plating, thermal or e-beam evaporation, or sputtering. The contact material may include a liner on trench sidewalls before filling the rest of the trench with an electrically conductive metal. Non-limiting liner materials include titanium nitride (TiN) and tantalum nitride (TaN). A planarization process such as CMP is performed to remove any unwanted electrically conductive material from the top surface of the structure 75.

The channel engineering techniques as described herein enable the fabrication of gate-all-around FETs having a gradient threshold voltage without drawbacks such as channel dopant diffusion and dopant variation associated with fabrication techniques that involve using a doping profile approach. The techniques described herein further facilitate the fabrication of short channel devices and may be employed for obtaining both n-type and p-type field-effect transistors. A steep potential distribution near the source side of the exemplary device 75 enhances the lateral channel electric field and thus increases carrier mobility and device performance.

The drawing figures as discussed above depict exemplary processing steps/stages in the fabrication of exemplary structures. Although the overall fabrication methods and the structures formed thereby are entirely novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example James D. Plummer et al., *Silicon VLSI Technology: Fundamentals, Practice, and Modeling* 1st Edition, Prentice Hall, 2001, which is hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices or other layers may not be explicitly shown in a given figure for ease of explanation. This does not imply that the semiconductor layer(s) or other layer(s) not explicitly shown are omitted in the actual integrated circuit device.

Given the discussion thus far, it will be appreciated that, in general terms, an exemplary method of fabricating a gate-all-around field-effect transistor includes obtaining a monolithic semiconductor structure such as the structures illustrated in FIGS. 2B and 2C. The exemplary monolithic structure includes a vertical stack of nanosheet layers 21 and sacrificial semiconductor layers 22, the nanosheet layers and the sacrificial semiconductor layers being arranged in alternating sequence. Each of the nanosheet layers 21 includes a source side lateral end portion 21A, a drain side lateral end portion 21B, and a middle portion between and integral with the source side lateral end portion and the drain side lateral end portion. The source side lateral end portion and the drain side lateral end portion of each nanosheet semiconductor layer extend laterally beyond the sacrificial silicon germanium layers 22. The monolithic structure further includes a dummy gate 24 on the vertical stack and outer dielectric spacers 26 adjoining the dummy gate. The source side lateral end portions 21A of the nanosheet channel layers 21 are thinned. Accordingly, the vertical distance between an opposing pair of the nanosheet layers is greater between the source side lateral end portions of the opposing pair of nanosheet channel layers than between the middle portions of the opposing pair of nanosheet channel layers. FIG. 2D schematically illustrates a monolithic structure 50 obtained following the thinning of the source side lateral end portions 21A. Inner dielectric spacers are formed between the source side lateral end portions 21A and between the drain side lateral end portions 21B of the nanosheet layers 21. Such spacers are optionally multi-layer spacers 52/54 as shown in FIG. 2F. The method further includes epitaxially growing a source region 56A and a drain region 56B, respectively, on the source side lateral end portions 21A and the drain side lateral end portions 21B of the nanosheet channel layers 21. A structure 60 as shown in FIG. 2G is obtained following growth of the source and drain regions.

The exemplary method may be continued by removing the dummy gate 24 to form a trench 62 bounded by the dielectric outer spacers 26, such as shown in FIG. 2H. The sacrificial semiconductor (e.g. silicon germanium) layers are selectively removed with respect to the nanosheet layers 21 to form a plurality of spaces 64 between and in alternating sequence with the nanosheet layers. A gate dielectric layer 30 is formed within the trench 62 and on the nanosheet layers 21 and a metal gate 32 is formed over the gate dielectric layer. Gate stacks as shown, for example, in FIG. 2J, are thereby formed in the horizontal spaces 64 between the channel layers 21. The method may further include removing portions of the inner dielectric spacers prior to forming the gate dielectric layer using, for example, an etch-back process as described with respect to FIG. 2I. The spaces 64 between nanosheet layers 21 following removal of the portions of the inner dielectric spacers will each have a portion having the dimensions corresponding to the sacrificial semiconductor layers 22. The spaces 64 will further include enlarged end portions near the source regions 56A as spacer etch-back exposes portions of the thinned source side lateral end portions 21A of the nanosheet channel layers 21. The metal gate formed within the spaces 64 between nanosheet channel layers will accordingly include relatively thick portions near the source regions 56A and relatively thin portions between the middle portions of the nanosheet channel layers 21. The formation of inner dielectric spacers from an oxide layer 52 on the sacrificial semiconductor layers and a different dielectric material (e.g. silicon nitride) on the oxide layer facilitates removal of portions of the inner dielectric spacers prior to formation of the gate stacks.

An exemplary gate-all-around field-effect transistor is schematically illustrated in FIGS. 2J and 2K. The transistor includes a vertical stack of nanosheet layers 21, each of the nanosheet layers including a source side lateral end portion 21A, a drain side lateral end portion 21B, and a middle portion between and integral with the source side lateral end portion and the drain side lateral end portion. The source side lateral end portion 21A of each nanosheet layer has a smaller thickness than the middle portion and the drain side lateral end portion thereof. Gate stacks are in alternating sequence with and operatively associated with the nanosheet layers 21. Epitaxial source and drain regions 56A, 56B are operatively associated with the nanosheet layers. The transistor has a gradient threshold voltage obtained, at least in part, from the profile configurations of the nanosheet layers 21. Specifically, an asymmetric $V_t$ profile is obtained that includes a steep potential distribution near the source side that enhances the lateral channel electric field and thus increases carrier mobility. $V_t$ is relatively high on the source side and is relatively low on the drain side.

In some embodiments, the thinned source side lateral end portion 21A of each nanosheet layer 21 has an average thickness that is about one to three nanometers less than the average thickness of the remaining portion of the layer. The source side lateral end portion 21A of each nanosheet layer may have an essentially uniform first thickness. The middle portion and the drain side lateral end portion 21B thereof have an essentially uniform second thickness that is greater than the thickness of the source side lateral end portion 21A. The gate stacks, being formed between channel regions of the nanosheet semiconductor layers 21 having portions of different thickness, may also have dual profiles wherein the portions of the gate stacks nearest to the source region 56A have greater thickness than the remaining portions of the gate stacks. The gate-all-around field-effect transistor further includes inner dielectric spacers 52/54 between the source side lateral end portions and between the drain side lateral end portions of the nanosheet layers, wherein the inner dielectric spacers include oxide portions 52 adjoining the nanosheet layers and silicon nitride portions 54 between the oxide portions.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having gate-all-around FET devices formed in accordance with one or more of the exemplary embodiments.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this invention. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments may be referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" and "vertical" are used to indicate relative positioning of elements or structures to each other as opposed to relative elevation.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. § 1.72(b). It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A gate-all-around field-effect transistor, comprising:
   a vertical stack of nanosheet layers, each of the nanosheet layers including:
      a source side lateral end portion,
      a drain side lateral end portion having a drain side thickness, and
      a channel portion between and integral with the source side lateral end portion and the drain side lateral end portion, wherein the channel portion further comprises:
         an end portion integral with the source side lateral end portion and having an end portion thickness; and
         a main portion integral with the drain side lateral end portion, integral with the end portion, and having a main portion thickness;
         a step formed around the channel portion, between the end portion and the main portion;
         wherein the end portion thickness is less than the main portion thickness; and
         wherein the main portion thickness is the same as the drain side lateral end portion thickness;
   a gate wrapping around and operatively associated with the nanosheet layers, wherein the gate includes a high-k gate dielectric layer and a gate metal layer;
   an epitaxial source region adjoining the source side lateral end portions of the nanosheet layers and operatively associated with the nanosheet layers, wherein the source side lateral end portions of the nanosheet layers end at the epitaxial source region; and
   an epitaxial drain region adjoining the drain side lateral end portions of the nanosheet layers and operatively associated with the nanosheet layers, wherein the drain side lateral end portions of the nanosheet layers end at the epitaxial drain region,
   wherein the channel portion is configured for providing threshold voltage asymmetry.

2. The gate-all-around field-effect transistor of claim 1, wherein the end portion thickness is one to three nanometers less than the main portion thickness.

3. The gate-all-around field-effect transistor of claim 1, wherein the channel region contacts the gate.

4. The gate-all-around field-effect transistor of claim 1, wherein the gate includes:
   a first gate portion formed at the drain side of at least one of the nanosheet layers, and
   a second gate portion formed at the step,
   wherein the second gate portion is thicker than the first gate portion.

5. The gate-all-around field-effect transistor of claim 4, further including a plurality of inner dielectric spacers between and in alternating sequence with the source side lateral end portions and between and in alternating sequence with the drain side lateral end portions of the nanosheet layers, each of the inner dielectric spacers contacting the gate.

6. The gate-all-around field-effect transistor of claim 5, wherein the inner dielectric spacers include oxide portions contacting the nanosheet layers and silicon nitride portions between the oxide portions.

7. The gate-all-around field-effect transistor of claim 1, wherein the nanosheet layers consist essentially of crystalline silicon.

8. The gate-all-around field-effect transistor of claim 7, wherein:
   the main portion of each of the nanosheet layers has a thickness between four and ten nanometers, and the source side lateral end portion of each of the nanosheet layers has a thickness between one and three nanometers less than the thickness of the main portion.

* * * * *